US012519472B2

(12) United States Patent
Lu et al.

(10) Patent No.: US 12,519,472 B2
(45) Date of Patent: Jan. 6, 2026

(54) CLOCK SIGNAL RECEIVER CIRCUIT WITH ACTIVE INDUCTANCE, COMMON MODE VOLTAGE SOURCE, AND NEGATIVE CAPACITANCE

(71) Applicant: QUALCOMM Incorporated, San Diego, CA (US)

(72) Inventors: Rundao Lu, San Diego, CA (US); Sameer Wadhwa, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 44 days.

(21) Appl. No.: 18/537,708

(22) Filed: Dec. 12, 2023

(65) Prior Publication Data

US 2025/0192782 A1  Jun. 12, 2025

(51) Int. Cl.
| | |
|---|---|
| H03K 19/0185 | (2006.01) |
| H03F 1/56 | (2006.01) |
| H03F 3/45 | (2006.01) |
| H03K 5/24 | (2006.01) |
| H03K 19/0948 | (2006.01) |

(52) U.S. Cl.
CPC ....... *H03K 19/018521* (2013.01); *H03F 1/56* (2013.01); *H03F 3/45183* (2013.01); *H03F 3/45273* (2013.01); *H03K 5/2481* (2013.01); *H03K 19/0948* (2013.01); *H03F 2200/261* (2013.01)

(58) Field of Classification Search
CPC ......... H03K 19/018521; H03K 5/2481; H03K 19/0948; H03K 19/018528; H03K 19/0944; H03K 19/094; H03F 1/56; H03F 3/45183; H03F 3/45273; H03F 2200/261; H03F 3/45179; H03F 3/45188; H03F 3/45192
See application file for complete search history.

(56) References Cited

U.S. PATENT DOCUMENTS 8,693,557 B1  4/2014 Zhang et al.
9,647,618 B1 * 5/2017 Yuan ................... H03F 3/45197

OTHER PUBLICATIONS

Covington J.M.C., et al., "A Cross-Coupled CMOS Negative Capacitor for Wideband Metamaterial Applications", Department of Electrical and Computer Engineering, The University of North Carolina at Charlotte Charlotte, NC, USA, 2014, 5 Pages.
Partial International Search Report—PCT/US2024/057808—ISA/EPO—ISA/EPO—Mar. 28, 2025.
International Search Report and Written Opinion—PCT/US2024/057808—ISA/EPO—May 20, 2025.

* cited by examiner

*Primary Examiner* — Jung Kim
(74) *Attorney, Agent, or Firm* — Loza & Loza, LLP

(57) ABSTRACT

An apparatus, such as a clock signal receiver circuit, is disclosed. The apparatus includes a common mode voltage generator configured to generate a common mode voltage at an output; an input circuit comprising: a first field effect transistor (FET); a second FET; a first capacitor coupled between a first differential clock input and a first gate of the first FET; a second capacitor coupled between a second differential clock input and a second gate of the second FET; a first resistive device coupled between the output of the common mode voltage generator and the first gate of the first FET; and a second resistive device coupled between the output of the common mode voltage generator and the second gate of the second FET; and an active inductance circuit coupled in series with the first and second FETs between an upper voltage rail and a lower voltage rail, respectively.

11 Claims, 5 Drawing Sheets

CLOCK SIGNAL RECEIVER CIRCUIT WITH ACTIVE INDUCTANCE, COMMON MODE VOLTAGE SOURCE, AND NEGATIVE CAPACITANCE

FIELD

Aspects of the present disclosure relate generally to serializer-deserializer (SerDes) communication links, and in particular, to a clock signal receiver including an active inductance circuit, an input circuit including a common voltage source, one or more negative capacitances, and a current mode logic (CML) to complementary metal oxide semiconductor (CMOS) converter.

BACKGROUND OF THE INVENTION

A serializer/deserializer (SerDes) communication link serves to communicate one or more data signals and an associated clock signal from a transmitting device to a receiving device. The receiving device in a clock forwarding SerDes architecture typically includes a clock signal receiver configured to process the clock signal for data detection of the associated one or more data signals.

SUMMARY OF THE INVENTION

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a common mode voltage generator configured to generate a common mode voltage at an output; an input circuit comprising: a first field effect transistor (FET) (e.g. FIG. 4, M41); a second FET (e.g. FIG. 4, M42); a first capacitor (e.g. FIG. 4, C41) coupled between a first differential clock input and a first gate of the first FET; a second capacitor (e.g. FIG. 4, C42) coupled between a second differential clock input and a second gate of the second FET; a first resistive device (e.g. FIG. 4, R41) coupled between the output of the common mode voltage generator and the first gate of the first FET; and a second resistive device (e.g. FIG. 4, R42) coupled between the output of the common mode voltage generator and the second gate of the second FET; and an active inductance circuit (e.g. FIG. 4, M54 and M55) coupled in series with the first and second FETs between an upper voltage rail and a lower voltage rail, respectively.

Another aspect of the disclosure relates to a method. The method includes alternating-current (AC) coupling a first differential clock signal to gates of a differential pair of field effect transistors (FETs), respectively; providing a common mode voltage to the gates of the differential pair of FETs, respectively; and amplifying the first differential clock signal including operating an active inductance circuit with the differential pair of FETs to generate a second differential clock signal.

Another aspect of the disclosure relates to an apparatus. The apparatus includes means for alternating-current (AC) coupling a first differential clock signal to gates of a differential pair of field effect transistors (FETs), respectively; means for providing a common mode voltage to the gates of the differential pair of FETs, respectively; and means for amplifying the first differential clock signal including operating an active inductance circuit with the differential pair of FETs to generate a second differential clock signal.

Another aspect of the disclosure relates to a wireless communication device. The wireless communication device includes: at least one antenna; a wireless transceiver including a radio frequency (RF) front end coupled to the at least one antenna, wherein the wireless transceiver includes a first data/clock signal transceiver; a serializer/deserializer (SerDes) communication link coupled to the first data/clock signal transceiver; and at least one integrated circuit (IC) including one or more signal processing cores coupled to a second data/clock signal transceiver, wherein the second data/clock signal transceiver is coupled to the SerDes communication link.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
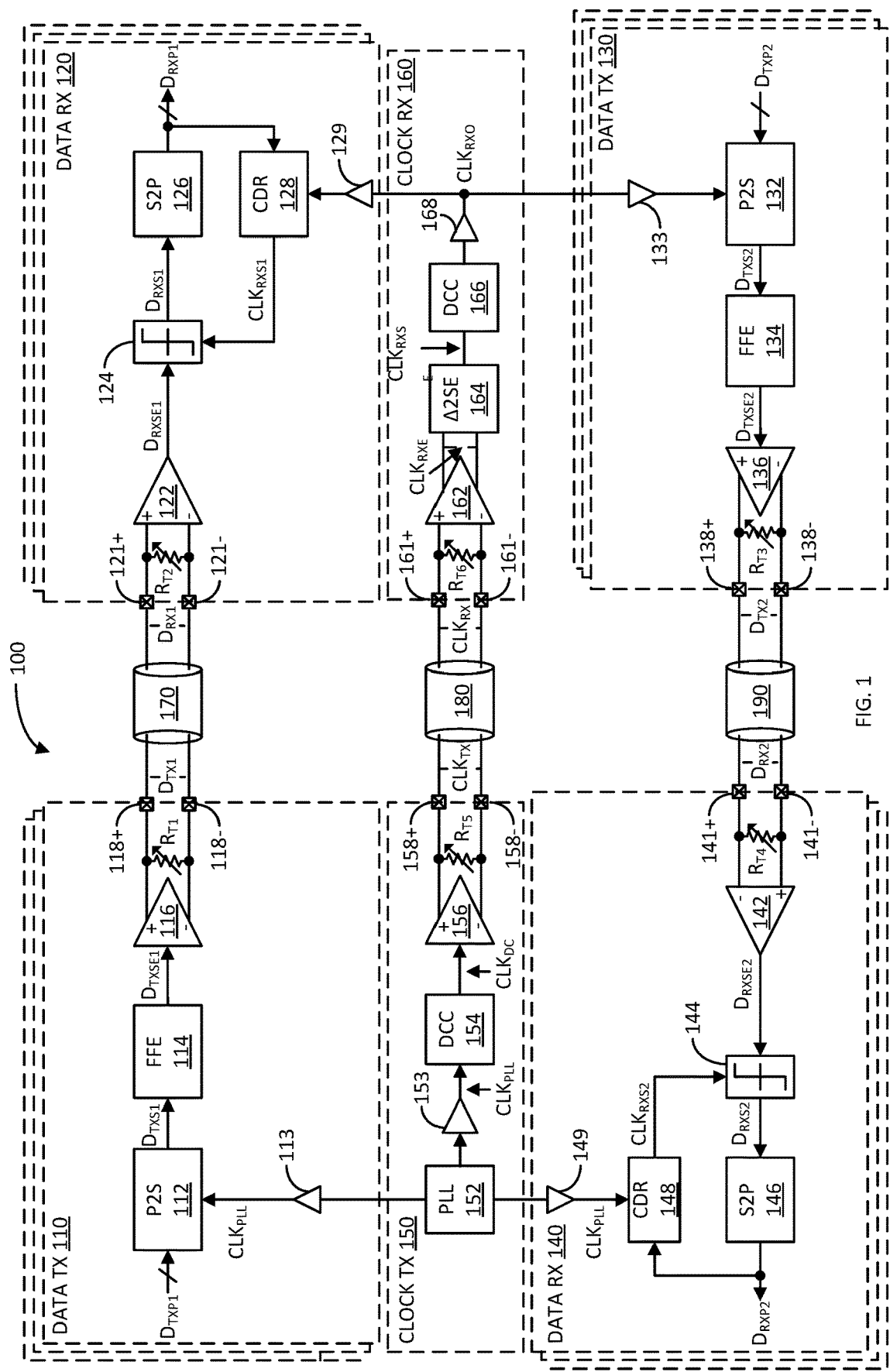
FIG. 1 illustrates a block diagram of an example clock forwarding serializer-deserializer (SerDes) communication link in accordance with an aspect of the disclosure.

FIG. 1 illustrates a block diagram of an example clock forwarding serializer-deserializer (SerDes) communication link 100 in accordance with an aspect of the disclosure. The SerDes communication link 100 includes a first set of one or more data lanes (shown as slices) for communicating data from a clock signal transmitter side (left-side) to a clock receiver side (right-side). Each of the first set of one or more data lanes includes a data signal transmitter 110, a channel 170, and a data signal receiver 120. Similarly, the SerDes communication link 100 includes a second set of one or more data lanes (shown as slices) for communicating data from the clock receiver side to the clock transmitter side. Each of the second set of one or more data lanes includes a data signal transmitter 130, a channel 190, and a data signal receiver 140. Further, the SerDes communication link 100 includes a clock data lane including a clock signal transmitter 150, a channel 180, and a clock signal receiver circuit 160. A clock signal may be a periodic square wave signal for clocking the transmission and reception of data.

The data signal transmitter 110, in turn, includes a parallel-to-serial (P2S) converter 112, a feed-forward equalizer (FFE) 114, a transmit driver 116, a first termination resistor $R_{T1}$ (which may be variable), differential output pads 118+/118−, and a clock buffer 113. In one example, the differential output pads 118+/118− may include electrostatic discharge (ESD) protection circuits (not shown). The P2S converter 112 is configured to receive and serialize a parallel data signal $D_{TXP1}$ (e.g., generated at a downstream component (e.g., modem)) based on a phase locked loop (PLL)-base clock signal $CLK_{PLL}$ received via the clock buffer 113 to generate a serial data signal $D_{TXS1}$. The FFE 114 is configured to equalize the serial data signal $D_{TXS1}$ to generate an equalized data signal $D_{TXSE1}$ to compensate for signal losses incurred while propagating via the channel 170. The transmit driver 116 is configured to amplify and/or level shift the equalized data signal $D_{TXSE1}$ to generate a differential transmit signal $D_{TX1}$ Across the Differential Output Pads 118+/118−. The first termination resistor $R_{T1}$ may be set to a characteristic impedance Zo of the channel 170 to reduce unwanted signal reflections at the data signal transmitter 110. The differential transmit signal $D_{TX1}$ propagates to the data signal receiver 120 via the channel 170.

The data signal receiver 120 includes differential input pads 121+/121−, a second termination resistor $R_{T2}$ (which may be variable), an amplifier/equalizer 122 (e.g., a variable gain amplifier followed by a continuous time linear equalizer (CTLE) or a CTLE with gain), a slicer 124, a serial-to-parallel (S2P) converter 126, a clock and data recovery (CDR) circuit 128, and a clock buffer 129. As it propagates through the channel 170, the transmit data signal $D_{TX1}$ arrives as a received data signal $D_{RX1}$ at the data signal receiver 120. The second termination resistor $R_{T2}$ may be set to the characteristic impedance Zo of the channel 170 to reduce unwanted signal reflections at the data signal receiver 120. The amplifier/equalizer 122 amplifies and equalizes the received data signal $D_{RX1}$ (e.g., to compensate for signal losses across the channel 170) to generate an amplified/equalized data signal $D_{RXSE1}$. The slicer 124 converts the amplified/equalized data signal $D_{RXSE1}$ into a serial data signal $D_{RXS1}$. The S2P converter 126 converts the serial data signal $D_{RXS1}$ into parallel data signal $D_{RXP1}$, which may be provided to a transmitter front end for wireless transmission. The CDR 128 generates a clock signal $CL_{KRXS1}$ (e.g., with a clocking edge substantially in the middle of the eye diagram associated with the serial data signal $D_{RXS1}$) based on the parallel data signal $D_{RXP1}$ and an output received clock signal $CLK_{RXO}$ received via the clock buffer 129.

Similarly, the data signal transmitter 130 includes a parallel-to-serial (P2S) converter 132, a feed-forward equalizer (FFE) 134, a transmit driver 136, a third termination resistor $R_{T3}$ (which may be variable), differential output pads 138+/138−, and a clock buffer 133. The P2S converter 132 is configured to receive and serialize a parallel data signal $D_{TXP2}$ (e.g., generated at an upstream component (e.g., receiver front end) based on a clock signal received via the clock buffer 133 to generate a serial data signal $D_{TXS2}$. The FFE 134 is configured to equalize the serial data signal $D_{TXS2}$ to generate an equalized data signal $D_{TXSE2}$ to compensate for signal losses while propagating via the channel 190. The transmit driver 136 is configured to amplify and/or level shift the equalized data signal $D_{TXSE2}$ to generate a differential transmit signal $D_{TX2}$ across the differential output pads 138+/138−. The third termination resistor $R_{T3}$ may be set to a characteristic impedance Zo of the channel 190 to reduce unwanted signal reflections at the data signal transmitter 130. The differential transmit signal $D_{TX2}$ propagates to the data signal receiver 140 via the channel 190.

The data signal receiver 140 includes differential input pads 141+/141−, a fourth termination resistor $R_{T4}$ (which may be variable), an amplifier/equalizer 142 (e.g., a variable gain amplifier followed by a CTLE or CTLE with gain), a slicer 144, a serial-to-parallel (S2P) converter 146, a clock and data recovery (CDR) circuit 148, and a clock buffer 149. As it propagates through the channel 190, the transmit data signal $D_{TX2}$ arrives as a received data signal $D_{RX2}$ at the data signal receiver 140. The fourth termination resistor $R_{T4}$ may be set to the characteristic impedance Zo of the channel 190 to reduce unwanted signal reflections at the data signal receiver 140. The amplifier/equalizer 142 amplifies and equalizes the received data signal $D_{RX2}$ (e.g., to compensate for signal losses across the channel 190) to generate an amplified/equalized data signal $D_{RXSE2}$. The slicer 144 converts the amplified/equalized data signal $D_{RXSE2}$ into a serial data signal $D_{RXS2}$. The S2P converter 146 converts the serial data signal $D_{RXS2}$ into parallel data signal $D_{RXP2}$, which may be provided to a modem for further processing. The CDR 148 generates a clock signal $CLK_{RXS2}$ (e.g., with clocking edge substantially in the middle of the eye diagram associated with the serial data signal $D_{RXS2}$) based on the parallel data signal $D_{RXP2}$ and the PLL-based clock signal $CLK_{PLL}$ received via the clock buffer 149.

The clock signal transmitter 150 includes a phase locked loop (PLL) 152, a clock buffer 153, a duty cycle controller (DCC) 154, a transmit driver 156, a fifth termination resistor $R_{T5}$, and differential output pads 158+/158−. The PLL 152 is configured to generate the PLL-based clock signal $CLK_{PLL}$ provided, as previously discussed, to the PS2 converter 112 via the clock buffer 113 of the data signal transmitter 110, and to the CDR 148 via the clock buffer 149 of the data signal receiver 140. The clock buffer 153 is configured to output the PLL-based clock signal $CLK_{PLL}$ from the PLL 152. The DCC 154 is configured to control the duty cycle of the PLL-based clock signal $CLK_{PLL}$ to generate a duty cycle-controlled clock signal $CLK_{DC}$. The transmit driver 156 is configured to amplify and/or level shift the duty cycle-controlled clock signal $CLK_{D}C$ to generate a differential transmit clock signal $CLK_{TX}$ across the differential output pads 158+/158−. The fifth termination resistor $R_{T5}$ may be set to a characteristic impedance Zo of the channel 180 to reduce unwanted signal reflections at the clock signal transmitter 150. The differential transmit clock signal $CLK_{TX}$ propagates to the clock signal receiver 160 via the channel 180.

The clock signal receiver 160 includes differential input pads 161+/161−, a sixth termination resistor $R_{T6}$ (which may be variable), a clock signal receiver circuit 162, a differential-to-single-ended (Δ2SE) converter 164, a duty cycle controller (DCC) 166, and a clock buffer 168. As it propagates through the channel 180, the transmit clock signal $CLK_{TX}$ arrives as a received data signal $CLK_{RX}$ at the clock signal receiver 160. The sixth termination resistor $R_{T6}$ may be set to the characteristic impedance Zo of the channel 180 to reduce unwanted signal reflections at the clock signal receiver 160. As discussed in more detail further herein, the clock signal receiver circuit 162 amplifies, equalizes, and converts to rail-to-rail swing the received clock signal $CLK_{RX}$ to generate a differential amplified/equalized/rail-to-rail clock signal $C_{RXE}$. The Δ2SE converter 164 is configured to convert the clock signal $CLK_{RXE}$ into a single-ended clock signal $CLK_{RXSE}$. The clock buffer 168 is configured to buffer the single-ended clock signal $CLK_{RXSE}$ to generate the output received clock signal $CLK_{RXO}$, which, as previously discussed, is provided to the CDR 128 via the clock buffer 129 of the data signal receiver 120, and to the P2S 132 via the clock buffer 133 of the data signal transmitter 130.

Figure 2:
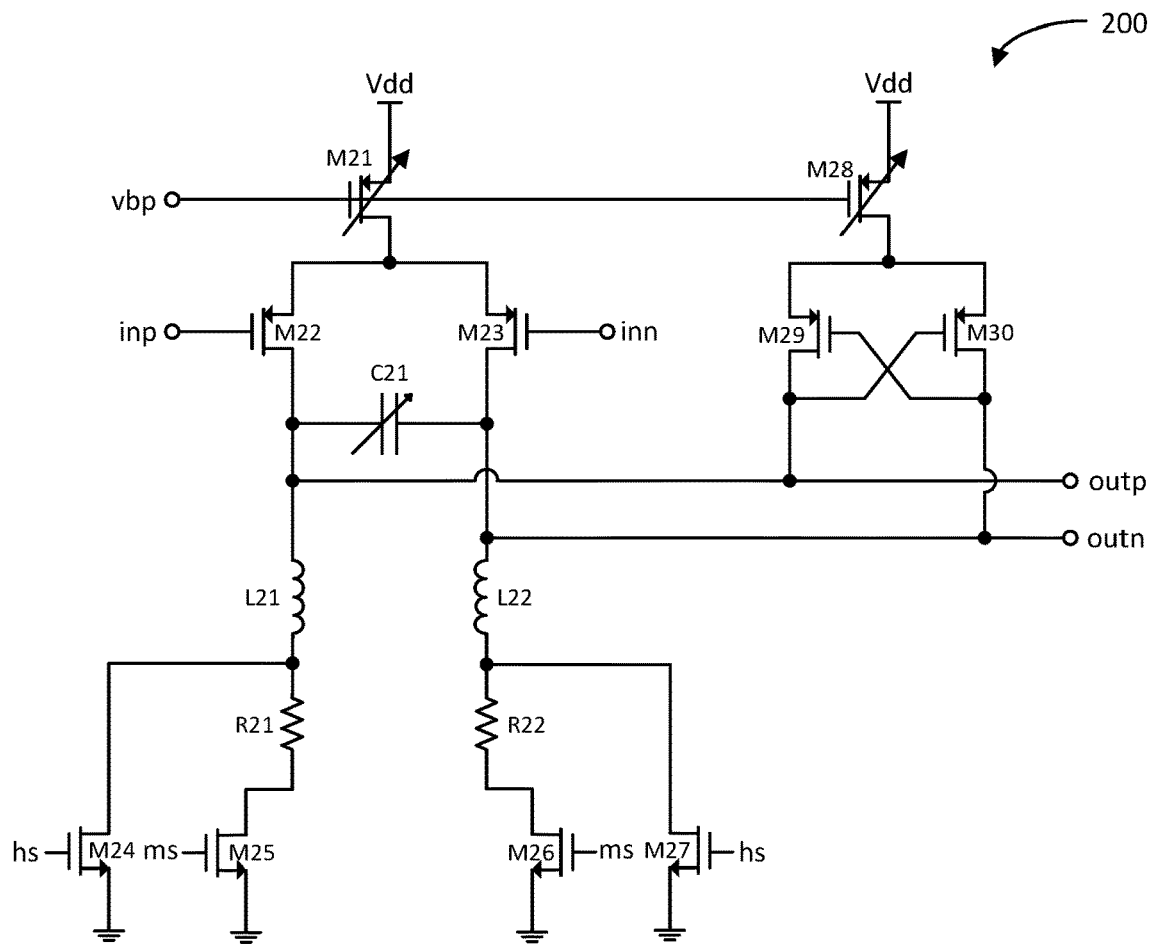
FIG. 2 illustrates a schematic diagram of an example clock signal receiver circuit in accordance with another aspect of the disclosure.

FIG. 2 illustrates a schematic diagram of an example clock signal receiver circuit 200 in accordance with another aspect of the disclosure. The clock signal receiver circuit 200 may be an example implementation of the clock signal receiver circuit 162 of the SerDes communication link 100.

The clock signal receiver circuit 200 includes a current source in the form of a field effect transistor (FET) (e.g., p-channel FET) M21 including a source coupled to an upper voltage rail Vdd and a drain coupled to respective sources of FETs M22 and M23 (e.g., also p-channel FETs). The FET M21 may have a variable or programmable size for setting current ranges for the current source. The FET M21 includes a gate configured to receive a bias voltage vbp for setting the current (within the programmed current range) generated by the current source FET M21. The FETs M22 and M23 operate as an input differential pair including gates configured to receive a differential clock signal inp/inn (e.g., $CLK_{RX}$), respectively.

The clock signal receiver circuit 200 further includes an inductor-capacitor (LC) tank circuit including capacitor C21 (which may be variable) coupled across the drains of FETs M22 and M23, respectively. The LC tank circuit may further include a pair of inductors L21 and L22 coupled between the drains of FETs M22 and M23 and drains of FETs M24 and M27 (e.g., n-channel FETs), respectively. Additionally, for de-Qing the LC tank circuit, the clock signal receiver circuit 200 further includes a pair of resistors R21 and R22 coupled between the inductors L21 and L22 and drains of FETs M25 and M26 (e.g., n-channel FETs), respectively. The FETs M24 and M27, and M25 and M26 include gates configured to receive a high speed (hs) control signal and a medium speed (ms) control signal, respectively. The sources of the FETs M24-M27 are coupled to a lower voltage rail (e.g., ground). The clock signal receiver circuit 200 includes a differential output outp/outn coupled to nodes between the drains of FETs M22 and M23 and inductors L21 and L22, respectively.

The clock signal receiver circuit 200 further includes a negative resistance circuit including a current source in the form of a FET M28 (e.g., p-channel FET) coupled between the upper voltage rail Vdd and respective sources of FETs M29 and M30 (e.g., also p-channel FETs), respectively. The FET M28 may have a variable or programmable size for setting current ranges for the current source. The FET M28 includes a gate configured to receive the bias voltage vbp for setting the current (within the programmed current range) generated by the current source FET M28. The FETs M29 and M30 include gates coupled to the drains of FETs M30 and M29, and to the differential output outp/outn, respectively. Although, for ease of illustration, the lines connecting the gates (M29/M30) to the drains (M30/M29) are shown to crisscross; however, they do not connect.

In operation, for high speed (hs) or frequency clock signal operation (e.g., higher speed or frequency than medium speed (ms)), the hs control signal is asserted and the ms control signal is deasserted. This causes FETs M24 and M27 to turn on, and FETs M25 and M26 to turn off. Thus, the clock signal receiver circuit 200 is configured to include a substantially non-de-Qed LC circuit tuned to the frequency of the clock signal inp/inn to provide an output amplified clock signal outp/outn. For medium speed (ms) or frequency clock signal operation, the hs control signal is de-asserted and the ms control signal is asserted. This causes FETs M24 and M27 to turn off, and FETs M25 and M26 to turn on. This causes the resistors R21 and R22 to de-Q the LC tank circuit to save power when a lower frequency clock signal inp/inn is received. Thus, the clock signal receiver circuit 200 is configured to include a de-Qed LC circuit tuned to the frequency of the clock signal inp/inn to provide an output amplified clock signal outp/outn. The negative resistance circuit (e.g., M28-M30) counters parasitic resistance associated with the LC tank to support the target resonance of the LC tank.

There may be several drawbacks associated with the clock signal receiver circuit 200. For example, the common mode voltage associated with the received clock signal inp/inn may drift, and may cause operational problems if it drifts too high, such as, reducing the gate-to-source voltages of FETs M22 and M23, which may adversely reduce or substantially cease the current flowing through such devices. Further, the clock signal receiver circuit 200 may consume significant power via the inductors L21/L22, resistors R21/R22, and FETs M24-M27. Additionally, such inductors L21/L22 and resistors R21/R22 may consume significant circuit or integrated circuit (IC) area, which may not be desirable. Lastly, the clock signal receiver circuit 200 may introduce clock signal latency (e.g., due to LC injection-locking delay), which may cause jitter (e.g., high N-cycle jitter) for the output clock signals $CLK_{RXS1}$ applied to the slicer 124 (e.g., the clocking edge of the clock signal $CLK_{RXS1}$ may jitter around the middle of the eye diagram of the received data signal $D_{RXSE1}$).

Figure 3:
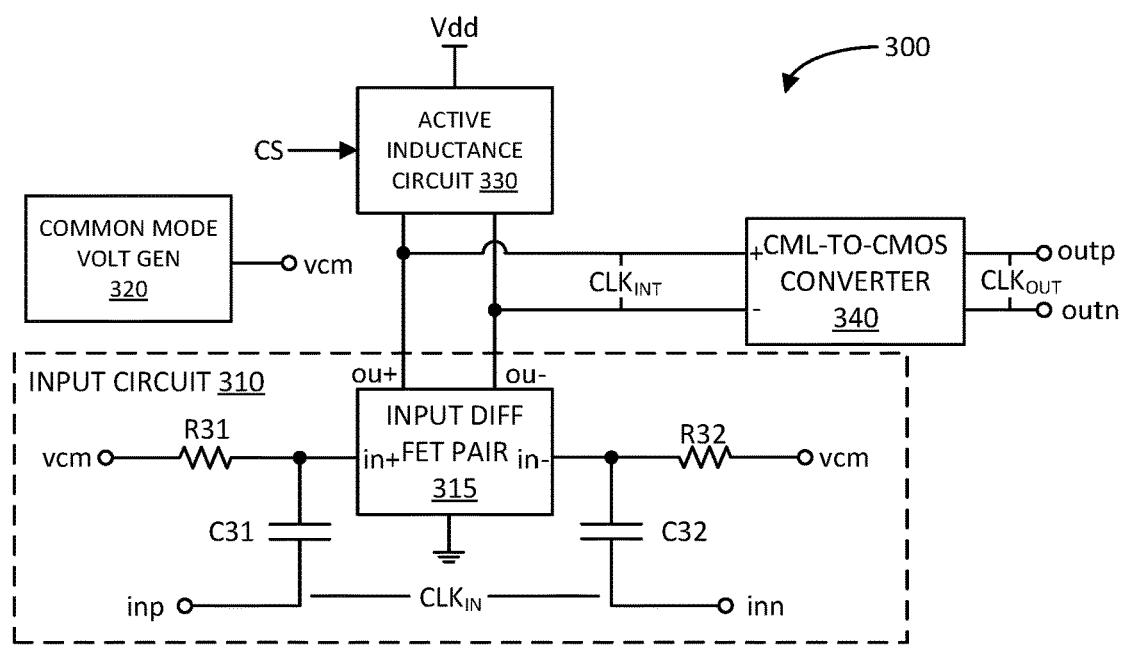
FIG. 3 illustrates a block diagram of another example clock signal receiver circuit in accordance with another aspect of the disclosure.

FIG. 3 illustrates a block diagram of another example clock signal receiver circuit 300 in accordance with another aspect of the disclosure. The clock signal receiver circuit 300 may be an example implementation of the clock signal receiver circuit 160 of the SerDes communication link 100. As discussed in more detail further herein, the clock signal receiver circuit 300 addresses the drawbacks discussed with the clock signal receiver circuit 200.

For example, an input differential clock signal is alternating current (AC)-coupled into the input differential pair 315, and an internally generated common mode voltage vcm is applied to the input differential pair 315. This effectively eliminates any common mode voltage drift coming from the input clock signal. Additionally, the inductors L21/L22, resistors R21/R22, and de-Qing mode FETs M24-M27 are eliminated for power and circuit area savings. Further, the clock signal receiver circuit 300 includes an active inductance circuit 330 for better controlling the frequency pole or peaking to achieve a desired frequency response for the clock signal receiver circuit 300. In a more detailed implementation, the clock signal receiver circuit 300 includes input and output negative capacitance to mitigate or counteract parasitic capacitance, and provide a fast phase step response for improved clock jitter (e.g., N-cycle clock jitter).

In particular, the clock signal receiver circuit 300 includes an input circuit 310, a common mode voltage generator 320, an active inductance circuit 330, and a current mode logic to complementary metal oxide semiconductor (CML-to-CMOS) converter 340. The input circuit 310, in turn, includes an input differential FET pair 315, a pair of ac-coupled capacitors C31 and C32, and a pair of resistors R31 and R32 (e.g., generally resistive devices). The ac-coupled capacitors C31 and C32 are coupled between differential clock signal inputs inp/inn and differential inputs in+/in− (e.g., gates) of the input differential FET pair 315. Similarly, the resistors R31 and R32 are coupled between an output (vcm) of the common mode voltage generator 320 and the differential inputs in+/in− of the input differential FET pair 315.

The active inductance circuit 330 is differentially coupled in series with the input differential FET pair 315 (e.g., via its differential output ou+/ou−) between an upper voltage rail Vdd and a lower voltage rail (e.g., ground). The active inductance circuit 330 is configured to receive a control signal (CS) for controlling the frequency response of the clock signal receiver circuit 300. The CML-to-CMOS converter 340 includes differential inputs+/− coupled to the differential outputs ou+/ou− of the input differential FET pair 315. The CML-to-CMOS converter 340 includes a differential clock signal output outp/outn.

An input differential clock signal $CLK_{IN}$ is routed from the differential input inp/inn to the differential input in+/in− of the input differential FET pair 315 via the ac-coupled capacitors C31 and C32, respectively. Thus, the AC-coupled capacitors C31 and C32 substantially block the common mode voltage associated with the input differential clock signal $CLK_{IN}$. Thus, the clock signal receiver circuit 300 is not substantially prone to common mode drift of the input clock signal $CLK_{IN}$. Further, the common mode voltage generator 320 is configured to generate a substantially stable common mode voltage vcm that is applied to the differential input in+/in− of the input differential FET pair 315 via resistors R31 and R32, respectively.

The active inductance circuit 330 is configured to receive the control signal CS for controlling the frequency response (e.g., the pole or peaking) of the clock signal receiver circuit 300. Thus, the input differential FET pair 315 in combination with the active inductance circuit 330 is configured to generate an intermediate differential clock signal $CLK_{INT}$ at the differential output ou+/ou− of the input differential FET pair 315 that may be compensated for losses incurred while propagating via a channel. The CML-to-CMOS converter 340 is configured to receive and process the intermediate differential clock signal $CLK_{INT}$ to generate a rail-to-rail output differential clock signal $CLK_{OUT}$ at the differential output outp/outn.

Figure 4:
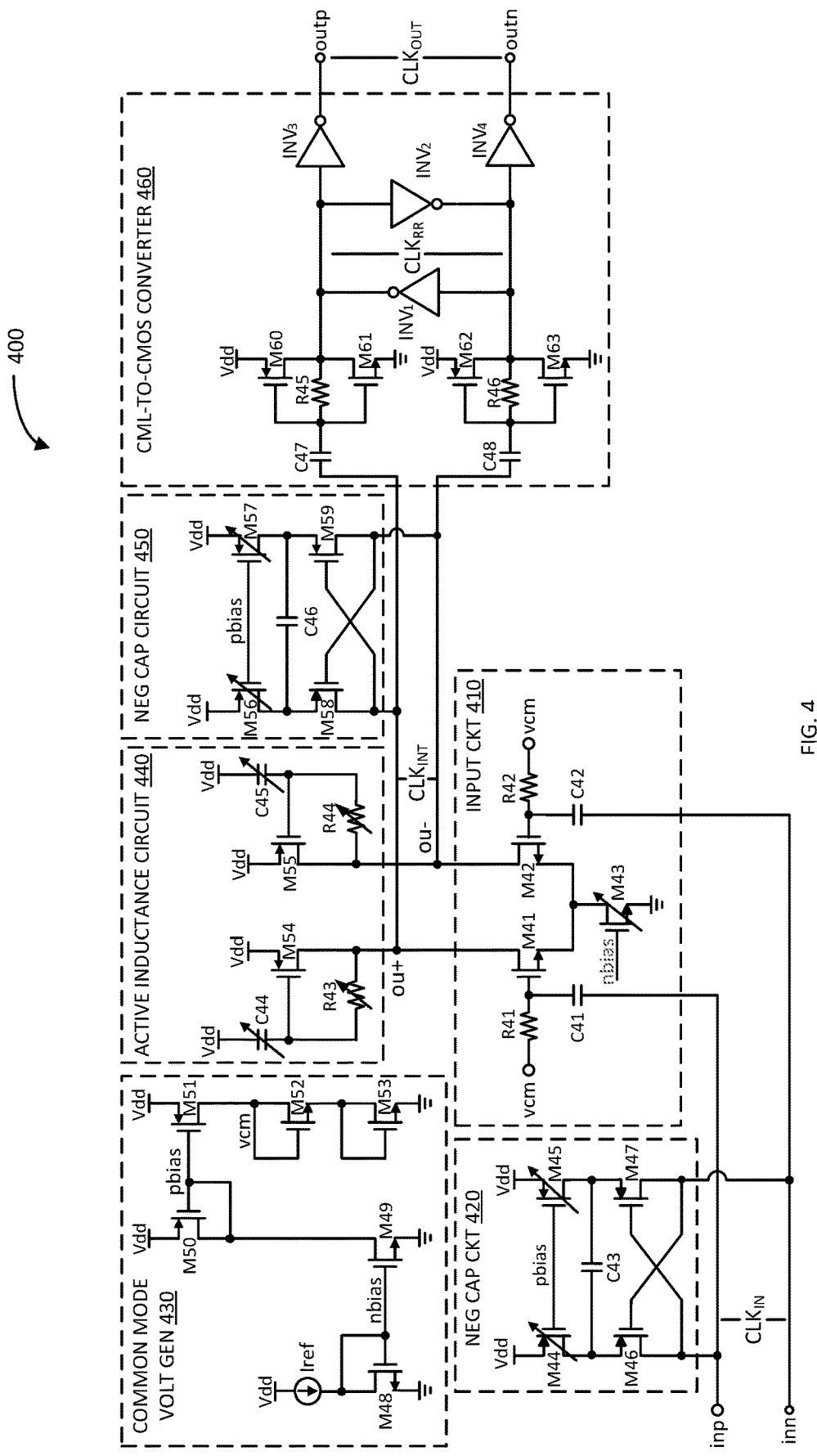
FIG. 4 illustrates a block diagram of another example clock signal receiver circuit in accordance with another aspect of the disclosure.

FIG. 4 illustrates a block diagram of another example clock signal receiver circuit 400 in accordance with another aspect of the disclosure. The clock signal receiver circuit 400 may be an example implementation of the clock signal receiver circuit 160 of the SerDes communication link 100. The clock signal receiver circuit 400 may be an example more detailed implementation of clock signal receiver circuit 300 previously discussed. The clock signal receiver circuit 400 includes an input circuit 410, a first negative capacitance circuit 420, a common mode voltage generator 430, an active inductance circuit 440, a second negative capacitance circuit 450, and a CML-to-CMOS converter 460.

The first negative capacitance circuit 420 includes a first FET M44 (e.g., p-channel FET, which may have a programmable size), and a second FET M46 (e.g., p-channel FET) coupled in series (via their respective sources and drains) between an upper voltage rail Vdd and a first (e.g., positive) differential input inp of the clock signal receiver circuit 400. The first negative capacitance circuit 420 further includes a third FET M45 (e.g., p-channel FET, which may have a programmable size), and a fourth FET M47 (e.g., p-channel FET) coupled in series (via their respective sources and drains) between the upper voltage rail Vdd and a second (e.g., negative) differential input inn of the clock signal receiver circuit 400. The FETs M44 and M45 include gates coupled together configured to receive a bias voltage pbias for setting the current through the FETs M44 and M45. Additionally, the first negative capacitance circuit 420 includes a capacitor C43 coupled across the drains of the FETs M44 and M45 (as well as across the sources of FETs M46 and M47). The FETs M46 and M47 include gates coupled to the differential input inn/inp, respectively.

The common mode voltage generator 430 includes a reference current source Iref (e.g., a bandgap current source) coupled in series with a drain and source of first FET M48 (e.g., n-channel) between the upper voltage rail Vdd and a lower voltage rail (e.g., ground). The FET M48 includes a gate coupled to its drain. The common mode voltage generator 430 further includes a second FET M50 (e.g., p-channel) coupled in series with a third FET M49 (e.g., n-channel) (via their respective source/drain and drain/source) between the upper voltage rail Vdd and the lower voltage rail. The FET M49 includes a gate coupled to the gate of FET M48, both configured to receive a bias voltage nbias. The FET M50 includes a gate coupled to its drain. Additionally, the common mode voltage generator 430 includes a fourth FET (e.g., p-channel FET), a first diode-connected FET M52, and a second diode-connected FET M53 coupled in series between the upper voltage rail Vdd and the lower voltage rail. The FET M51 includes a gate coupled to the gate of FET M50, both configured to receive bias voltage pbias. The three legs Iref-M48, M50-M49, and M51-M53 form a current mirror to mirror the reference current to the third leg, where a common mode voltage vcm is produced at the drains of FETs M51 and M52.

The input circuit 410 includes a differential FET pair M41 and M42 (e.g., n-channel FETs) respectively coupled in series with a FET M43 (e.g., n-channel FET, which may have a programmable size) between a differential output ou+/out− and the lower voltage rail. The FET M43 includes a gate configured to receive a bias voltage nbias. Additionally, the input circuit 410 includes ac-coupled capacitors C41 and C42 coupled between the differential input inp/inn of the clock signal receiver circuit 400 and the gates of FETs M41 and M42, respectively. Further, the input circuit 410 includes resistors R41 and R42 (e.g., generally resistive devices) coupled in series between the drains of FETs M41 and M42 (e.g., output of common mode voltage generator 430 where the common mode voltage vcm is generated) and the gates of FETs M41 and M42, respectively.

The active inductance circuit 440 includes a first FET M54 (e.g., p-channel FET) coupled between the upper voltage rail Vdd to the positive differential output ou+ of the input circuit 410. The active inductance circuit 440 includes a first capacitor C44 (e.g., which may have a programmable capacitance) coupled in series with a first resistor R43 (e.g., generally a resistive device, which may have a programmable resistance) between the upper voltage rail Vdd and the positive differential output ou+ of the input circuit 410. The active inductance circuit 440 includes a second capacitor C45 (e.g., which may have a programmable capacitance) coupled in series with a second resistor R44 (e.g., generally which may have a programmable resistance) between the upper voltage rail Vdd and the negative differential output ou− of the input circuit 410.

The second negative capacitance circuit 440 includes a first FET M56 (e.g., p-channel FET, which may have a programmable size), and a second FET M58 (e.g., p-channel FET) coupled in series (via their respective sources and drains) between the upper voltage rail Vdd and the positive differential output ou+ of the input circuit 410. The second negative capacitance circuit 450 further includes a third FET M57 (e.g., p-channel FET, which may have a programmable size), and a fourth FET M59 (e.g., p-channel FET) coupled in series (via their respective sources and drains) between the upper voltage rail Vdd and the negative differential output ou− of the input circuit 410. The FETs M56 and M57 include gates coupled together and configured to receive the bias voltage pbias for setting the current through the FETs M56 and M57. Additionally, the second negative capacitance circuit 450 includes a capacitor C46 coupled across the drains of the FETs M56 and M57 (as well as across the sources of FETs M58 and M59). The FETs M58 and M59 include gates coupled to the differential output ou−/ou+ of the input circuit 410, respectively.

The CML-to-CMOS converter 460 includes first and second ac-coupled capacitors C47 and C48, first and second feedback inverters (e.g., FETs M60 and M61, and feedback resistor R45; and FETs M62 and M63, and feedback resistor R46), a latch including cross-coupled inverters $INV_1$ and $INV_2$, and first and second output inverters $INV_3$ and $INV_4$. The first feedback inverter includes FET M60 (e.g., p-channel FET) coupled in series with FET M61 (e.g., n-channel FET) (via their respective source/drain and drain/source) between the upper voltage rail Vdd and the lower voltage rail. The first ac-coupled capacitor C47 is coupled between the positive differential output ou+ of the input circuit 410 and the gates of FETs M60 and M61. The feedback resistor R45 (e.g., generally a resistive device) is coupled between the drains and gates of FETs M60 and M61. The second feedback inverter includes FET M62 (e.g., p-channel FET) coupled in series with FET M63 (e.g., n-channel FET) (via their respective source/drain and drain/source) between the upper voltage rail Vdd and the lower voltage rail. The second ac-coupled capacitor C48 is coupled between the negative differential output ou− of the input circuit 410 and the gates of FETs M62 and M63. The feedback resistor R46 (e.g., generally a resistive device) is coupled between the drains and gates of FETs M62 and M63.

The cross-coupled inverters $INV_1$ and $INV_2$ are coupled between the outputs (drains of FETs M60/M61 and M62/M63) of the first and second feedback inverters. The first and second output inverter $INV_3$ and $INV_4$ include inputs coupled to the outputs of the first and second feedback inverters and a differential output outp/outn of the clock signal receiver circuit 400.

In operation, an input differential clock signal $CLK_{IN}$ is provided to the differential input inp/inn of the clock signal receiver circuit 400. The differential clock signal $CLK_{IN}$ is ac-coupled to the gates of the input differential FET pair M41 and M42 via the ac-coupled capacitors C41 and C42, respectively. The ac-coupled coupled capacitors C41 and C42 substantially block a common mode voltage associated with the input differential clock signal $CLK_{IN}$ so that the operation of the clock signal receiver circuit 400 is not affected by drifts by such common mode voltage. The common mode voltage vcm, which may be substantially stable due to the bandgap current reference Iref, is applied to the gates of the input differential FET pair M41 and M42 via the resistors R41 and R42, respectively. Thus, this effectively eliminates operational issues with common mode voltage drifts. The first negative capacitance circuit 420 counteracts or mitigates parasitic capacitance associated with the input circuit 410 to improve the bandwidth of the clock signal receiver circuit 400.

The active inductance circuit 440 presents an active inductance output impedance for the input circuit 410 to produce a relatively high frequency pole or peaking in the frequency response of the clock signal receiver circuit 460. The programmable capacitance of the capacitors C44 and C45 and the programmable resistance of the resistors R43 and R44 may be set to place the high frequency pole to generate an intermediate differential clock signal $CLK_{INT}$ across the differential output ou+/ou− of the input circuit 410 based on the input differential clock signal $CLK_{IN}$, and compensated for channel losses incurred by the input differential clock signal $CLK_{IN}$. The second negative capacitance circuit 450 counteracts or mitigates parasitic capacitance at associated with the input of the CML-to-CMOS converter 460 to improve the bandwidth of the clock signal receiver circuit 400.

The CML-to-CMOS converter 460 generates a rail-to-rail (e.g., substantially Vdd to ground potential) output differential clock signal $CLK_{OUT}$ across the differential output outp/outn of the clock signal receiver circuit 400. The first and second feedback inverters M60-M61-R45 and M62-M63-R46 receive the intermediate differential clock signal $CLK_{INT}$ via the ac-coupled capacitors C47 and C48, respectively. The first and second feedback inverters M60-M61-R45 and M62-M63-R46 convert the intermediate differential clock signal $CLK_{INT}$ to a substantially rail-to-rail differential clock signal $CLK_{RR}$. The latch (cross-coupled inverters $INV_1$ and $INV_2$) latches the rail-to-rail differential clock signal $CLK_{RR}$. The output inverters $INV_3$ and $INV_4$ (e.g., serving as buffers) invert the rail-to-rail differential clock signal $CLK_{RR}$ to generate the output differential clock signal $CLK_{OUT}$.

In one example, the CMOS-only clock signal receiver circuit 400 of FIG. 4 may replace the LC injection-locking based clock signal receiver circuit 200 of FIG. 2. While both clock signal receiver circuits of FIG. 2 and FIG. 4 may achieve the same functionality, the clock signal receiver is more power/area efficient, has less injection-locking delay, and is more robust to input vcm levels.

Figure 5:
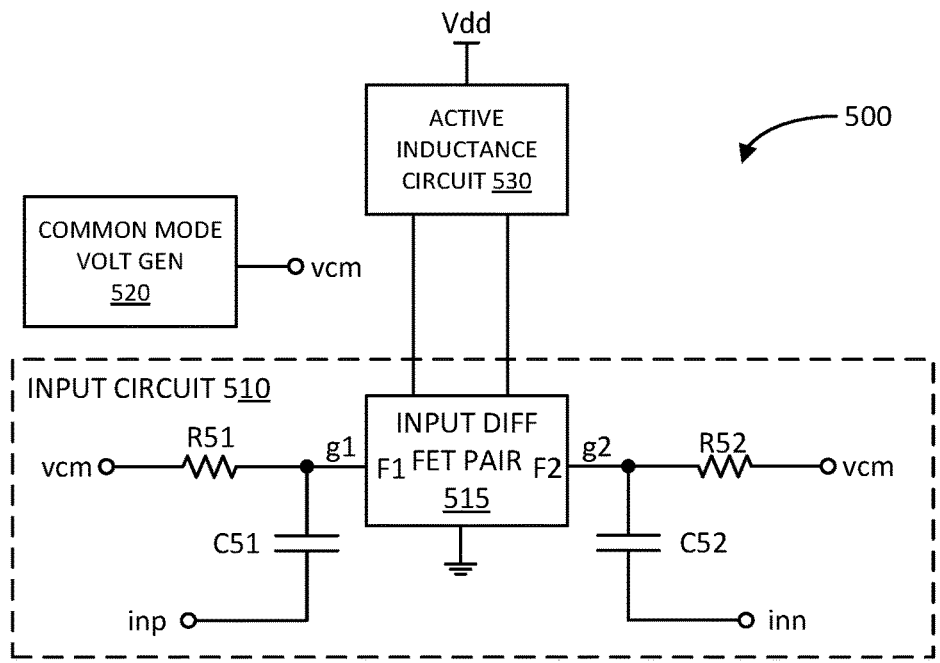
FIG. 5 illustrates a schematic diagram of another example clock signal receiver circuit in accordance with another aspect of the disclosure.

FIG. 5 illustrates a schematic diagram of another example clock signal receiver circuit 500 in accordance with another aspect of the disclosure. The clock signal receiver circuit 500 may be an example implementation of the clock signal receiver circuit 162 of the SerDes communication link 100. The clock signal receiver circuit 500 includes a common mode voltage generator 520 configured to generate a common mode voltage vcm at an output.

The clock signal receiver circuit 500 further includes an input circuit 510 including: a differential pair 515 (i.e., a first field effect transistor (FET) F1 and a second FET F2), a first capacitor C51 coupled between a first differential clock input inp and a first gate g1 of the first FET F1, a second capacitor C52 coupled between a second differential clock input inn and a second gate g2 of the second FET F2, a first resistive device R51 coupled between the output of the common mode voltage generator 520 and the first gate g1 of the first FET F1, and a second resistive device R52 coupled between the output of the common mode voltage generator 520 and the second gate g2 of the second FET F2. The clock signal receiver circuit 500 further includes an active inductance circuit 530 differentially coupled in series with the first and second FETs F1 and F2 between an upper voltage rail Vdd and a lower voltage rail (e.g., ground), respectively.

Figure 6:
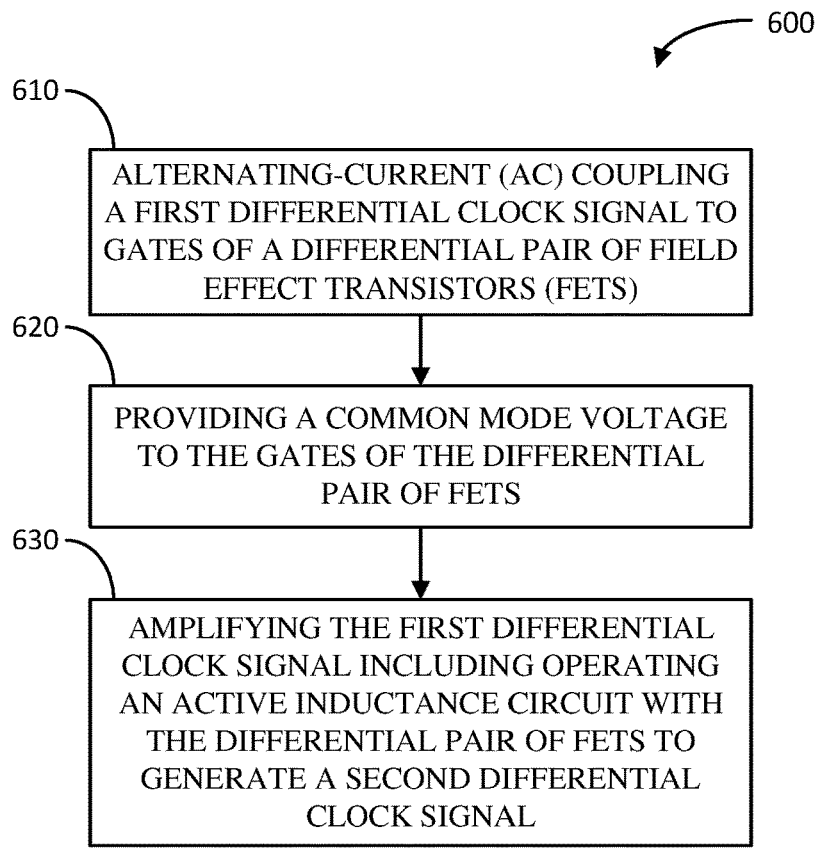
FIG. 6 illustrates a flow diagram of an example method of processing a clock signal in accordance with another aspect of the disclosure.

FIG. 6 illustrates a flow diagram of an example method 600 of processing a clock signal in accordance with another aspect of the disclosure. The method 600 includes alternating-current (AC) coupling a first differential clock signal to gates of a differential pair of field effect transistors (FETs) (block 610). Examples of means for alternating-current (AC) coupling a first differential clock signal to gates of a differential pair of field effect transistors (FETs) include any of the ac-coupling capacitors C31-C32, C41-C42, and C51-C52.

The method 600 further includes providing a common mode voltage to the gates of the differential pair of FETs (block 620). Examples of means for providing a common mode voltage to the gates of the differential pair of FETs include any of the common mode voltage generators 320, 430, and 520 and any of the resistive devices R31-R32, R41-R42, and R51-R52. Additionally, the method 600 includes amplifying the first differential clock signal including operating an active inductance circuit with the differential pair of FETs to generate a second differential clock signal (block 630). Examples of means for amplifying the first differential clock signal including operating an active inductance circuit with the differential pair of FETs to generate a second differential clock signal include any of the input differential FET pairs 315 and 515, FETs M41 and M42, and active inductance circuits 330, 440, and 530.

Figure 7:
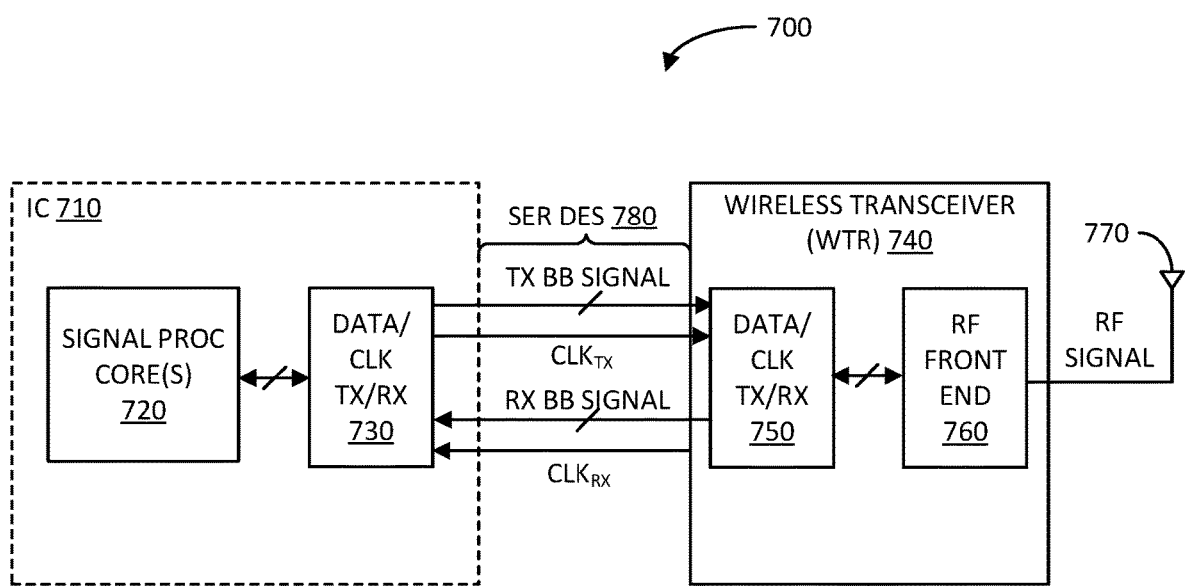
FIG. 7 illustrates a block diagram of an example wireless communication device in accordance with another aspect of the disclosure.

FIG. 7 illustrates a block diagram of an example wireless communication device 700 in accordance with another aspect of the disclosure. The wireless communication device 700 may be a smart phone, a desktop computer, laptop computer, tablet device, Internet of Things (IoT), wearable wireless device (e.g., wireless watch), and other types of wireless device.

In particular, the wireless communication device 700 includes an integrated circuit (IC), which may be implemented as a system on chip (SOC) 710. The SOC 710 includes one or more signal processing cores 720 including a data/clock signal transceiver 730. The one or more signal processing cores 720 may be configured to generate a transmit baseband (BB) signal and process a received baseband (BB) signal. The data/clock signal transceiver 730 may be configured to transmit the transmit baseband (BB) signal along with a transmit clock signal $CLK_{TX}$ to a wireless transceiver (WTR) 740, and receive the received baseband (BB) signal along with a received clock signal $CLK_{RX}$ from the wireless transceiver (WTR) 740 both via a serializer/deserializing (SerDes) communication link 780. With regard to receiving the received clock signal $CLK_{RX}$, the data/clock signal transceiver 730 may include a clock signal receiver, such as one of the clock signal receivers 300, 400, and 500 described herein.

The wireless communication device 700 may further include the wireless transceiver (WTR) 740 and at least one antenna 770 (e.g., an antenna array). The transceiver 740 is configured to convert the transmit BB signal into a transmit radio frequency (RF) signal, and convert a received RF signal into the received BB signal. In this regard, the wireless transceiver (WTR) 740 includes a data/clock signal transceiver 750 configured to receive the transmit baseband (BB) signal along with the transmit clock signal $CLK_{TX}$, and transmit the received baseband (BB) signal along with the received clock signal $CLK_{RX}$ to the data/clock signal transceiver 730 of the IC 710 both via the SerDes communication link 780. With regard to receiving the transmit clock signal $CLK_{TX}$, the data/clock signal transceiver 750 may include a clock signal receiver, such as one of the clock signal receiver circuits 300, 400, and 500 described herein.

The transceiver 740 further includes a radio frequency (RF) front end 760 configured to convert the transmit baseband (BB) signal into a transmit RF signal, and convert a received RF signal into the received baseband (BB) signal. The transceiver 740 is coupled to the at least one antenna 770 to provide thereto the transmit RF signal for electromagnetic radiation into a wireless medium for wireless transmission, and receive the received RF signal electromagnetically picked up from the wireless medium by the at least one antenna 770.

The following provides an overview of aspects of the present disclosure:

Aspect 1: An apparatus, comprising: a common mode voltage generator configured to generate a common mode voltage at an output; an input circuit comprising: a first field effect transistor (FET); a second FET; a first capacitor coupled between a first differential clock input and a first gate of the first FET; a second capacitor coupled between a second differential clock input and a second gate of the second FET; a first resistive device coupled between the output of the common mode voltage generator and the first gate of the first FET; and a second resistive device coupled between the output of the common mode voltage generator and the second gate of the second FET; and an active inductance circuit coupled in series with the input circuit (e.g., first and second FETs) between an upper voltage rail and a lower voltage rail, respectively.

Aspect 2: The apparatus of aspect 1, wherein the input circuit further comprises a third FET coupled between the first and second FETs and the lower voltage rail, wherein the third FET includes a third gate configured to receive a bias voltage.

Aspect 3: The apparatus of aspect 1 or 2, wherein a size of the third FET is programmable.

Aspect 4: The apparatus of any one of aspects 1-3, wherein the active inductance circuit comprises: a third FET coupled between the upper voltage rail and the first FET of the input circuit; a fourth FET coupled between the upper voltage rail and the second FET of the input circuit; a first capacitor coupled in series with a third resistive device between the upper voltage rail and a first node between the first and third FETs, wherein a second node between the first capacitor and the third resistive device is coupled to a third gate of the third FET; and a second capacitor coupled in series with a fourth resistive device between the upper voltage rail and a third node between the second and fourth FETs, wherein a fourth node between the second capacitor and the fourth resistive device is coupled to a fourth gate of the fourth FET.

Aspect 5: The apparatus of aspect 4, wherein the first and second capacitors are each configured with a programmable capacitance.

Aspect 6: The apparatus of aspect 4 or 5, wherein the third and fourth resistive devices are each configured with a programmable resistance.

Aspect 7: The apparatus of any one of aspects 1-6, wherein the common mode voltage generator comprises: a current source configured to generate a first current; one or more current mirrors configured to generate a second current based on the first current; and one or more diode-connected FETs configured to generate the common mode voltage based on the second current.

Aspect 8: The apparatus of any one of aspects 1-7, further comprising a current mode logic to complementary metal oxide semiconductor (CML-to-CMOS) converter including a first differential input coupled to a first node between the active inductance circuit and the first FET of the input circuit, and a second differential input coupled to a second node between the active inductance circuit and the second FET of the input circuit.

Aspect 9: The apparatus of aspect 8, wherein the CML-to-CMOS converter comprises: a first feedback inverter; a third capacitor coupled between the first node and a first input of the first feedback inverter; a second feedback inverter; and a fourth capacitor coupled between the second node and a second input of the feedback inverter.

Aspect 10: The apparatus of aspect 9, wherein the CML-to-CMOS converter further comprises: a latch coupled across first and second outputs of the first and second feedback inverters, respectively; a first inverter coupled between the first output of the first feedback inverter and a first differential clock output; and a second inverter coupled between the second output of the second feedback inverter and a second differential clock output.

Aspect 11: The apparatus of any one of aspects 1-10, further comprising a negative capacitance circuit coupled to the first and second differential clock inputs.

Aspect 12: The apparatus of any one of aspects 1-11, further comprising a negative capacitance circuit coupled to first and second nodes between the active inductance circuit and the first and second FETs, respectively.

Aspect 13: A method, comprising: alternating-current (AC) coupling a first differential clock signal to gates of a differential pair of field effect transistors (FETs), respectively; providing a common mode voltage to the gates of the differential pair of FETs, respectively; and amplifying the first differential clock signal including operating an active inductance circuit with the differential pair of FETs to generate a second differential clock signal.

Aspect 14: The method of aspect 13, wherein ac coupling the first differential clock signal to the gates of the differential pair of FETs comprises passing the first differential clock signal through a pair of capacitors, respectively.

Aspect 15: The method of aspect 13 or 14, wherein providing a common mode voltage to the gates of the differential pair of FETs comprises passing the first differential clock signal through a pair of resistors, respectively.

Aspect 16: The method of any one of aspects 13-15, further comprising generating the common mode voltage.

Aspect 17: The method of any one of aspects 13-16, further comprising applying negative capacitance to a differential input receiving the first differential clock signal.

Aspect 18: The method of any one of aspects 13-17, further comprising: generating the second differential clock signal at a differential output of the differential pair of FETs, respectively; and applying negative capacitance to the differential output of the differential pair of FETs, respectively.

Aspect 19: The method of any one of aspects 13-18, further comprising generating a third differential clock signal with substantially rail-to-rail voltage swing based on the second differential clock signal.

Aspect 20: The method of any one of aspects 13-19, further comprising operating the active inductance circuit to achieve a particular frequency response associated with generating the second differential clock signal.

Aspect 21: An apparatus, comprising: means for alternating-current (AC) coupling a first differential clock signal to gates of a differential pair of field effect transistors (FETs), respectively; means for providing a common mode voltage to the gates of the differential pair of FETs, respectively; and means for amplifying the first differential clock signal including operating an active inductance circuit with the differential pair of FETs to generate a second differential clock signal.

Aspect 22: A wireless communication device, comprising: at least one antenna; a wireless transceiver including a radio frequency (RF) front end coupled to the at least one antenna, wherein the wireless transceiver includes a first data/clock signal transceiver; a serializer/deserializer (SerDes) communication link coupled to the first data/clock signal transceiver; and at least one integrated circuit (IC) including one or more signal processing cores coupled to a second data/clock signal transceiver, wherein the second data/clock signal transceiver is coupled to the SerDes communication link.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
    a common mode voltage generator configured to generate a common mode voltage at an output, wherein the common mode voltage generator comprises:
        a current source configured to generate a first current;
        one or more current mirrors configured to generate a second current based on the first current; and
        one or more diode-connected FETs configured to generate the common mode voltage based on the second current;
    an input circuit comprising:
        a first field effect transistor (FET);
        a second FET;
        a first capacitor coupled between a first differential clock input and a first gate of the first FET;
        a second capacitor coupled between a second differential clock input and a second gate of the second FET;
        a first resistive device coupled between the output of the common mode voltage generator and the first gate of the first FET; and
        a second resistive device coupled between the output of the common mode voltage generator and the second gate of the second FET; and
    an active inductance circuit coupled in series with the input circuit between an upper voltage rail and a lower voltage rail, respectively.

2. The apparatus of claim 1, wherein the input circuit further comprises a third FET coupled between the first and second FETs and the lower voltage rail, wherein the third FET includes a third gate configured to receive a bias voltage.

3. The apparatus of claim 2, wherein a size of the third FET is programmable.

4. The apparatus of claim 1, wherein the active inductance circuit comprises:

a third FET coupled between the upper voltage rail and the first FET of the input circuit;

a fourth FET coupled between the upper voltage rail and the second FET of the input circuit;

a first capacitor coupled in series with a third resistive device between the upper voltage rail and a first node between the first and third FETs, wherein a second node between the first capacitor and the third resistive device is coupled to a third gate of the third FET; and a second capacitor coupled in series with a fourth resistive device between the upper voltage rail and a third node between the second and fourth FETs, wherein a fourth node between the second capacitor and the fourth resistive device is coupled to a fourth gate of the fourth FET.

5. The apparatus of claim 4, wherein the first and second capacitors are each configured with a programmable capacitance.

6. The apparatus of claim 4, wherein the third and fourth resistive devices are each configured with a programmable resistance.

7. The apparatus of claim 1, further comprising a current mode logic to complementary metal oxide semiconductor (CML-to-CMOS) converter including a first differential input coupled to a first node between the active inductance circuit and the first FET of the input circuit, and a second differential input coupled to a second node between the active inductance circuit and the second FET of the input circuit.

8. The apparatus of claim 7, wherein the CML-to-CMOS converter comprises:

a first feedback inverter;

a third capacitor coupled between the first node and a first input of the first feedback inverter;

a second feedback inverter; and a fourth capacitor coupled between the second node and a second input of the feedback inverter.

9. The apparatus of claim 8, wherein the CML-to-CMOS converter further comprises:

a latch coupled across first and second outputs of the first and second feedback inverters, respectively;

a first inverter coupled between the first output of the first feedback inverter and a first differential clock output; and a second inverter coupled between the second output of the second feedback inverter and a second differential clock output.

10. The apparatus of claim 1, further comprising a negative capacitance circuit coupled to the first and second differential clock inputs.

11. The apparatus of claim 1, further comprising a negative capacitance circuit coupled to first and second nodes between the active inductance circuit and the first and second FETs, respectively.

* * * * *